United States Patent
Okamoto et al.

(10) Patent No.: US 12,233,745 B2
(45) Date of Patent: Feb. 25, 2025

(54) ESTIMATION DEVICE, ESTIMATION METHOD, AND COMPUTER PROGRAM

(71) Applicant: GS Yuasa International Ltd., Kyoto (JP)

(72) Inventors: Naohisa Okamoto, Kyoto (JP); Kazuki Sekiya, Kyoto (JP); Yasuyuki Hamano, Kyoto (JP); Hidetoshi Wada, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 529 days.

(21) Appl. No.: 17/765,223

(22) PCT Filed: Oct. 2, 2020

(86) PCT No.: PCT/JP2020/037501
§ 371 (c)(1),
(2) Date: Mar. 30, 2022

(87) PCT Pub. No.: WO2021/066126
PCT Pub. Date: Apr. 8, 2021

(65) Prior Publication Data
US 2022/0348109 A1    Nov. 3, 2022

(30) Foreign Application Priority Data
Oct. 3, 2019    (JP) .................. 2019-183333

(51) Int. Cl.
*B60L 58/12*    (2019.01)
*G01R 31/367*    (2019.01)
(Continued)

(52) U.S. Cl.
CPC ............ *B60L 58/12* (2019.02); *G01R 31/367* (2019.01); *G01R 31/374* (2019.01); *G01R 31/379* (2019.01)

(58) Field of Classification Search
CPC ..... B60L 58/12; G01R 31/367; G01R 31/374; G01R 31/379; G01R 31/52; G01R 31/389;
(Continued)

(56) References Cited

U.S. PATENT DOCUMENTS

2006/0186859 A1    8/2006    Fujikawa et al.
2011/0012604 A1    1/2011    Tsujiko et al.
(Continued)

FOREIGN PATENT DOCUMENTS

CN    108134126 A    6/2018
CN    108363016    8/2018
(Continued)

OTHER PUBLICATIONS

International Search Report (ISR) dated Dec. 8, 2020 filed in PCT/JP2020/037501.

*Primary Examiner* — Jack Chiang
*Assistant Examiner* — Brandon Bowers
(74) *Attorney, Agent, or Firm* — RANKIN, HILL & CLARK LLP

(57) ABSTRACT

An estimation device includes: an acquisition unit that acquires a voltage, a current, and a temperature of a lead-acid battery; a first deriving unit that derives a first SOC and a second SOC that are SOCs of a start point and an end point of an estimation period; a second deriving unit that derives a total amount of an overcharge amount in the estimation period; a third deriving unit that derives an actual measurement error based on a difference between the first SOC and the second SOC and the total amount of the overcharge amount; a first specification unit that specifies an estimation error based on the first SOC, the second SOC, and the temperature, and a relationship between the first SOC, the second SOC, and the temperature of the lead-acid battery,
(Continued)

and the estimation error; a second specification unit that specifies an abnormality degree of the actual measurement error based on the derived actual measurement error and the specified estimation error; and an estimation unit that estimates generation of an internal short-circuit of the lead-acid battery based on the abnormality degree.

3 Claims, 15 Drawing Sheets

(51) Int. Cl.
*G01R 31/374* (2019.01)
*G01R 31/379* (2019.01)

(58) Field of Classification Search
CPC .... G01R 31/392; H01M 10/06; H01M 10/42; H01M 10/486; H01M 10/48; H02J 7/00032; H02J 7/0029; H02J 7/0048; H02J 7/0047; Y02E 60/10

See application file for complete search history.

(56) References Cited

U.S. PATENT DOCUMENTS

| | | | |
|---|---|---|---|
| 2011/0148426 A1* | 6/2011 | Yokotani | H01M 10/48 |
| | | | 324/537 |
| 2012/0105014 A1 | 5/2012 | Nakayama et al. | |
| 2015/0331055 A1 | 11/2015 | Oi et al. | |
| 2017/0254856 A1 | 9/2017 | Shiraishi | |
| 2019/0113580 A1 | 4/2019 | Tenmyo et al. | |
| 2020/0266645 A1* | 8/2020 | Kim | H02J 7/0029 |
| 2021/0096190 A1 | 4/2021 | Yoshida et al. | |

FOREIGN PATENT DOCUMENTS

| | | |
|---|---|---|
| CN | 106802396 B | 4/2019 |
| EP | 3683913 A1 | 7/2020 |
| JP | 2002313435 A | 10/2002 |
| JP | 2006258797 A | 9/2006 |
| JP | 2009252381 A | 10/2009 |
| JP | 2010256210 A | 11/2010 |
| JP | 2015220863 A | 12/2015 |
| JP | 2017156187 A | 9/2017 |
| JP | 2019078571 A | 5/2019 |
| JP | 2019158831 A | 9/2019 |
| WO | 2011108249 A1 | 9/2011 |
| WO | 2018003210 A1 | 1/2018 |
| WO | 2019087462 A1 | 5/2019 |
| WO | 2019102735 A1 | 5/2019 |

* cited by examiner

Fig. 5

History

| Acquisition time [min] | 1 | 2 | ... | 60 | 61 | ... |
|---|---|---|---|---|---|---|
| Charge current [A] | ... | ... | ... | ... | ... | ... |
| Discharge current [A] | ... | ... | ... | ... | ... | ... |
| Amount of charge [Ah] | ... | ... | ... | ... | ... | ... |
| Discharge capacity [Ah] | ... | ... | ... | ... | ... | ... |
| Overcharge amount [Ah] | ... | ... | ... | ... | ... | ... |
| Voltage [V] | ... | ... | ... | ... | ... | ... |
| SOC [%] | ... | ... | ... | ... | ... | ... |
| Temperature [°C] | ... | ... | ... | ... | ... | ... |

Fig. 7

Relational data

| Average value of temperatures [°C] | First SOC [%] | Second SOC [%] | Estimation error [Ah] |
|---|---|---|---|
| 75 | 100 | 100 | 5 |
| | | 90 | . |
| | | . | . |
| | | . | . |
| | | . | . |
| | 90 | 100 | . |
| | | 90 | . |
| | | . | . |
| | | . | . |
| | | . | . |
| | . | . | . |
| | . | . | . |
| | . | . | . |
| . | . | . | . |
| . | . | . | . |
| . | . | . | . |
| 50 | 100 | 100 | . |
| | | 90 | . |
| | | . | . |
| | | . | . |
| | | . | . |
| | 90 | 100 | . |
| | | 90 | . |
| | | . | . |
| | | . | . |
| | | . | . |
| | . | . | . |
| | . | . | . |
| | . | . | . |
| . | . | . | . |
| . | . | . | . |
| . | . | . | . |

Fig. 10

Teacher data

| ID number | Actual measurement error [Ah] | First SOC [%] | Second SOC [%] | Average value of temperatures [°C] | Generation of short circuit |
|---|---|---|---|---|---|
| (1) | 40 | 83 | 96 | 50 | Existing |
| (2) | 15 | 78 | 90 | 25 | Nothing |
| ⋮ | ⋮ | ⋮ | ⋮ | ⋮ | ⋮ |
| ⋮ | ⋮ | ⋮ | ⋮ | ⋮ | ⋮ |
| ⋮ | ⋮ | ⋮ | ⋮ | ⋮ | ⋮ |

Fig. 14

History

| Acquisition time [min] | 1 | 2 | ... | 30 | 31 | ... | 60 | 61 | ... | 90 | ... |
|---|---|---|---|---|---|---|---|---|---|---|---|
| Charge current [A] | ... | ... | ... | ... | ... | ... | ... | ... | ... | ... | ... |
| Discharge current [A] | ... | ... | ... | ... | ... | ... | ... | ... | ... | ... | ... |
| Amount of charge [Ah] | ... | ... | ... | ... | ... | ... | ... | ... | ... | ... | ... |
| Discharge capacity [Ah] | ... | ... | ... | ... | ... | ... | ... | ... | ... | ... | ... |
| Charge-discharge ratio [-] | ... | ... | ... | ... | ... | ... | ... | ... | ... | ... | ... |
| Voltage [V] | ... | ... | ... | ... | ... | ... | ... | ... | ... | ... | ... |
| Average value of charge-discharge ratios [-] | 1.1 | | | | 1.2 | | | 1.3 | | | ... |
| Average voltage [V] | 12.8 | | | | 12.7 | | | 12.5 | | | ... |

ESTIMATION DEVICE, ESTIMATION METHOD, AND COMPUTER PROGRAM

TECHNICAL FIELD

The present disclosure relates to an estimation device, an estimation method, and a computer program for estimating generation of an internal short-circuit of a lead-acid battery.

BACKGROUND ART

A lead-acid battery includes a case in which a positive electrode plate, a negative electrode plate, and an electrolyte solution are accommodated. The positive electrode plate and the negative electrode plate are immersed in the electrolyte solution of the case. The lead-acid battery is used in applications such as on-vehicle applications and industrial applications. For example, an in-vehicle lead-acid battery is mounted on a vehicle, and supplies power to an in-vehicle unit (electric load) such as lighting and a car stereo. The lead-acid battery is charged with power generated by a generator (alternator) included in the vehicle. For example, an industrial lead-acid battery is used as a power supply source to an emergency power supply.

Patent Document 1 discloses a power supply system including a lead-acid battery that supplies power to an electric load of a vehicle, an acquisition device that acquires a temperature of the lead-acid battery, and a determination device that determines degradation of the lead-acid battery based on the acquired temperature.

PRIOR ART DOCUMENT

Patent Document

Patent Document 1: JP-A-2019-78571

SUMMARY OF THE INVENTION

Problems to be Solved by the Invention

The power supply system described above can determine the degradation of the lead-acid battery based on the acquired temperature of the lead-acid battery. In the lead-acid battery, an internal short-circuit may be generated due to factors such as contact between a positive electrode plate and a negative electrode plate due to the degradation of a separator, and contact between a conductive foreign material mixed in the lead-acid battery and the positive electrode plate and the negative electrode plate. When the internal short-circuit is generated, the lead-acid battery cannot supply the power to the electric load. Because the internal short-circuit is suddenly generated, the conventional technique has a problem in that the generation of the internal short-circuit cannot be previously estimated.

An object of the present disclosure is to provide an estimation device, an estimation method, and a computer program for estimating the generation of the internal short-circuit of the lead-acid battery.

Means for Solving the Problems

An estimation device according to the present disclosure includes: an acquisition unit that acquires a voltage, a current, and a temperature of a lead-acid battery; a first deriving unit that derives a first SOC and a second SOC that are SOCs of a start point and an end point of an estimation period; a second deriving unit that derives a total amount of an overcharge amount that is a difference between an amount of charge and a discharge capacity in the estimation period; a third deriving unit that derives an actual measurement error based on a difference between the derived first SOC and the derived second SOC and the derived total amount of the overcharge amount; a first specification unit that specifies an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount; a second specification unit that specifies an abnormality degree of the derived actual measurement error based on the derived actual measurement error and the specified estimation error; and an estimation unit that estimates generation of an internal short-circuit of the lead-acid battery based on the specified abnormality degree.

An estimation device according to the present disclosure includes: an acquisition unit that acquires a voltage, a current, and a temperature of a lead-acid battery; a first deriving unit that derives a first SOC and a second SOC that are SOCs of a start point and an end point of an estimation period; a second deriving unit that derives a total amount of an overcharge amount that is a difference between an amount of charge and a discharge capacity in the estimation period; a third deriving unit that derives an actual measurement error based on a difference between the derived first SOC and the derived second SOC and the derived total amount of the overcharge amount; a specification unit that inputs the derived actual measurement error, the derived first SOC, the derived second SOC, and the acquired temperature to a learning model that outputs an abnormality degree of the actual measurement error when the actual measurement error, the first SOC, the second SOC, and the temperature are input, and specifies the abnormality degree of the derived actual measurement error; and an estimation unit that estimates generation of an internal short-circuit of the lead-acid battery based on the specified abnormality degree.

An estimation device according to the present disclosure includes: an acquisition unit that acquires at least one of an amount of charge and a discharge capacity of a lead-acid battery and a voltage; and an estimation unit that estimates generation of an internal short-circuit of the lead-acid battery based on at least one of a charge-discharge ratio derived based on the acquired amount of charge and the acquired discharge capacity and the acquired voltage.

An estimation method according to the present disclosure includes: acquiring a voltage, a current, and a temperature of a lead-acid battery; deriving a first SOC and a second SOC that are SOCs of a start point and an end point of an estimation period; deriving a total amount of an overcharge amount that is a difference between an amount of charge and a discharge capacity in the estimation period; deriving an actual measurement error based on a difference between the derived first SOC and the derived second SOC and the derived total amount of the overcharge amount; specifying an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount; specifying an abnormality degree of the derived actual measurement error based on the derived actual measurement error and the specified estimation error; and estimating generation of an internal short-circuit of the lead-acid battery based on the specified abnormality degree.

A computer program according to the present disclosure causing a computer to execute: acquiring a voltage, a current, and a temperature of a lead-acid battery; deriving a first SOC and a second SOC that are SOCs of a start point and an end point of an estimation period; deriving a total amount of an overcharge amount that is a difference between an amount of charge and a discharge capacity in the estimation period; deriving an actual measurement error based on a difference between the derived first SOC and the derived second SOC and the derived total amount of the overcharge amount; specifying an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount; specifying an abnormality degree of the derived actual measurement error based on the derived actual measurement error and the specified estimation error; and estimating generation of an internal short-circuit of the lead-acid battery based on the specified abnormality degree.

BRIEF DESCRIPTION OF THE DRAWINGS

FIG. 5 is a conceptual diagram illustrating a content example of a history.

FIG. 7 is a conceptual diagram illustrating a content example of relational data.

FIG. 10 is a conceptual diagram illustrating a content example of teacher data.

FIG. 14 is a conceptual diagram illustrating a content example of a history.

MODE FOR CARRYING OUT THE INVENTION

Outline of Embodiments

Figure 1:
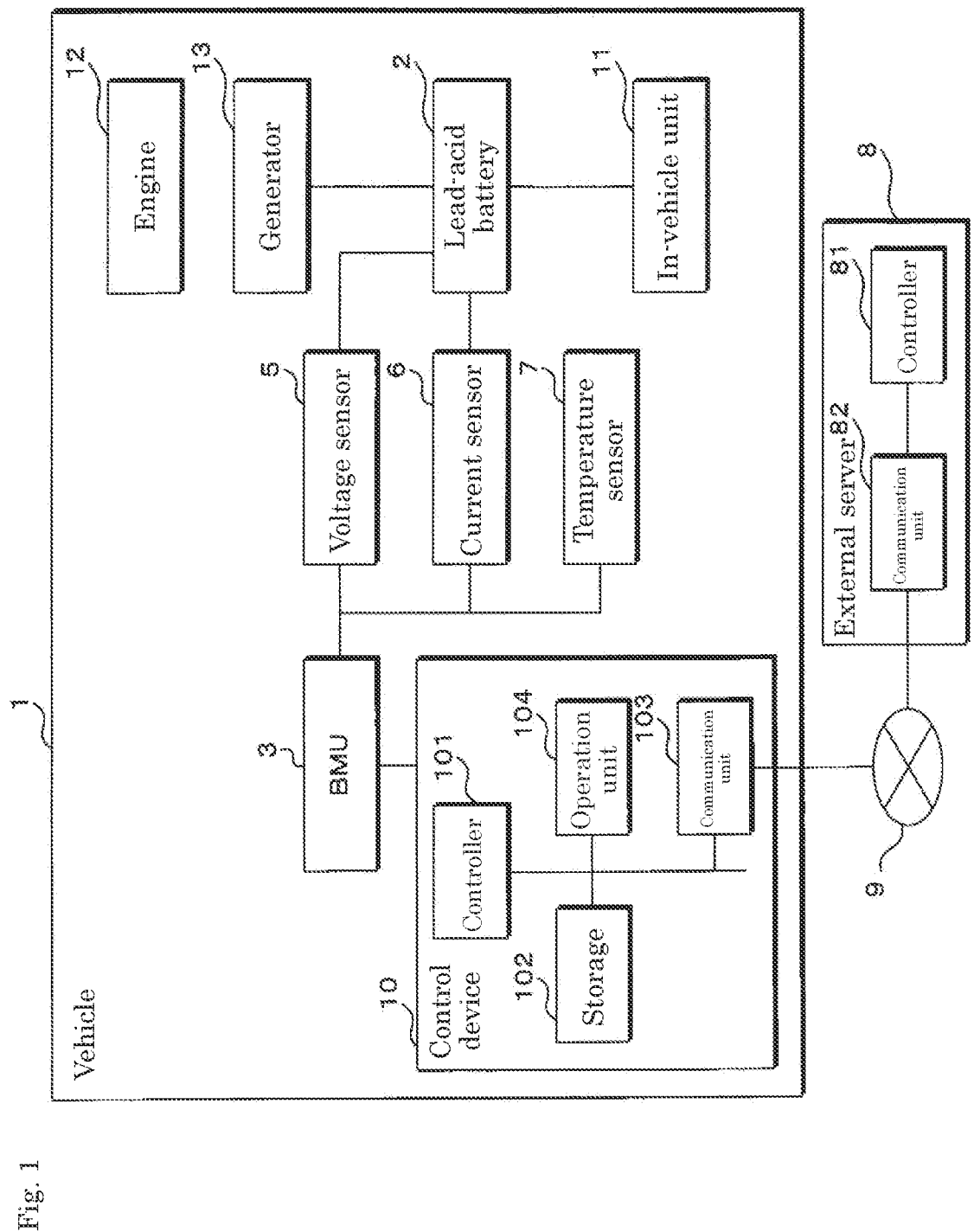
FIG. 1 is a block diagram illustrating a configuration of a vehicle according to a first embodiment.

An estimation device according to the embodiment includes: an acquisition unit that acquires a voltage, a current, and a temperature of a lead-acid battery; a first deriving unit that derives a first SOC and a second SOC that are SOCs of a start point and an end point of an estimation period; a second deriving unit that derives a total amount of an overcharge amount that is a difference between an amount of charge and a discharge capacity in the estimation period; a third deriving unit that derives an actual measurement error based on a difference between the derived first SOC and the derived second SOC and the derived total amount of the overcharge amount; a first specification unit that specifies an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount; a second specification unit that specifies an abnormality degree of the derived actual measurement error based on the derived actual measurement error and the specified estimation error; and an estimation unit that estimates generation of an internal short-circuit of the lead-acid battery based on the specified abnormality degree.

Although details will be described later, a state of charge (SOC), which is an index representing the remaining capacity of a battery such as the lead-acid battery, can be derived from the voltage of the lead-acid battery. An electric quantity in the lead-acid battery is derived from the SOC. A change amount of the electric quantity of the lead-acid battery in the estimation period is derived based on the difference between the first SOC and the second SOC. The amount of charge and the discharge capacity of the lead-acid battery can be derived from the current of the lead-acid battery, so that the overcharge amount, which is the difference between the amount of charge and the discharge capacity, can be derived. The actual measurement error, which is the difference between the change amount of the electric quantity of the lead-acid battery in the estimation period and the total amount of the overcharge amount in the estimation period, has a relationship between the first SOC and the second SOC and the temperature. The estimation error specified based on the relationship between the derived first SOC, second SOC, and the acquired temperature, and the first SOC, second SOC, and the temperatures of the lead-acid battery, and the later-described estimation error estimated based on the difference between the first SOC and the second SOC and the total amount of the overcharge amount. When a minute short-circuit, which is a precursor of the internal short-circuit, is generated in the lead-acid battery, the actual measurement error indicates an abnormal value deviated from the relationship between the SOC (first SOC and second SOC) before and after the change in the electric quantity and the temperature and is larger or smaller than the estimation error. According to the above configuration, the second specification unit specifies the abnormality degree of the derived actual measurement error based on the actual measurement error derived by the third deriving unit and the estimation error specified by the first specification unit. For example, the abnormality degree of the actual measurement error is a ratio between the derived actual measurement error and the specified estimation error. For example, when the abnormality degree of the actual measurement error is greater than or equal to a predetermined value, the estimation unit estimates that the internal short-circuit is generated in the lead-acid battery. The generation of the internal short-circuit can be previously estimated.

An estimation device according to the embodiment includes: an acquisition unit that acquires a voltage, a current, and a temperature of a lead-acid battery; a first deriving unit that derives a first SOC and a second SOC that are SOCs of a start point and an end point of an estimation period; a second deriving unit that derives a total amount of an overcharge amount that is a difference between an amount of charge and a discharge capacity in the estimation period; a third deriving unit that derives an actual measurement error based on a difference between the derived first SOC and the derived second SOC and the derived total amount of the overcharge amount; a specification unit that inputs the derived actual measurement error, the derived first SOC, the derived second SOC, and the acquired temperature to a learning model that outputs an abnormality degree of the actual measurement error when the actual measurement error, the first SOC, the second SOC, and the temperature are input, and specifies the abnormality degree of the derived actual measurement error; and an estimation unit that estimates generation of an internal short-circuit of the lead-acid battery based on the specified abnormality degree.

According to the above configuration, when the derived actual measurement error, the first SOC, the second SOC, and the acquired temperature are input, the abnormality degree of the derived actual measurement error is output and specified by the learning model. The abnormality degree of the actual measurement error can be accurately specified. The estimation unit previously estimates the generation of the internal short-circuit based on the specified abnormality degree of the actual measurement error.

An estimation device according to the embodiment includes: an acquisition unit that acquires at least one of an amount of charge and a discharge capacity of a lead-acid battery and a voltage; and an estimation unit that estimates generation of an internal short-circuit of the lead-acid battery based on at least one of a charge-discharge ratio derived based on the acquired amount of charge and the acquired discharge capacity and the acquired voltage.

When the minute short-circuit, which is the precursor of the internal short-circuit, is generated in the lead-acid battery, a discharge current that is not detected flows to a portion in which the minute short-circuit is generated, so that the amount of charge is larger than the discharge capacity. When the minute short-circuit is generated in the lead-acid battery, self discharge of the lead-acid battery is further accelerated, so that the voltage at the lead-acid battery is likely to decrease. According to the above configuration, a charge-discharge ratio (amount of charge/discharge capacity) is derived based on the acquired amount of charge and discharge capacity. For example, when the derived charge-discharge ratio is greater than or equal to a certain value, the estimation unit estimates that the internal short-circuit is generated in the lead-acid battery. For example, when the change amount of the periodically-acquired voltage is greater than or equal to the certain value, the estimation unit estimates that the internal short-circuit is generated in the lead-acid battery. The generation of the internal short-circuit can be previously estimated.

An estimation method according to the embodiment includes: acquiring a voltage, a current, and a temperature of a lead-acid battery; deriving a first SOC and a second SOC that are SOCs of a start point and an end point of an estimation period; deriving a total amount of an overcharge amount that is a difference between an amount of charge and a discharge capacity in the estimation period; deriving an actual measurement error based on a difference between the derived first SOC and the derived second SOC and the derived total amount of the overcharge amount; specifying an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount; specifying an abnormality degree of the derived actual measurement error based on the derived actual measurement error and the specified estimation error; and estimating generation of an internal short-circuit of the lead-acid battery based on the specified abnormality degree.

According to the above configuration, the abnormality degree of the derived actual measurement error is specified, and for example, when the specified abnormality degree is greater than or equal to a predetermined value, it can be estimated that the internal short-circuit is generated in the lead-acid battery.

A computer program according to the embodiment causing a computer to execute: acquiring a voltage, a current, and a temperature of a lead-acid battery; deriving a first SOC and a second SOC that are SOCs of a start point and an end point of an estimation period; deriving a total amount of an overcharge amount that is a difference between an amount of charge and a discharge capacity in the estimation period; deriving an actual measurement error based on a difference between the derived first SOC and the derived second SOC and the derived total amount of the overcharge amount; specifying an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount; specifying an abnormality degree of the derived actual measurement error based on the derived actual measurement error and the specified estimation error; and estimating generation of an internal short-circuit of the lead-acid battery based on the specified abnormality degree.

First Embodiment

Hereinafter, an embodiment of the present invention will be described based on the drawings. The case of estimating the generation of the internal short-circuit of the lead-acid battery mounted on the vehicle will be described as an example. FIG. 1 is a block diagram illustrating a configuration of a vehicle 1 according to a first embodiment. The vehicle 1 includes a control device 10, an in-vehicle unit 11, an engine 12, a generator (alternator) 13, a lead-acid battery (hereinafter, referred to as a battery) 2, and a battery management unit (BMU) 3. The vehicle 1 can communicate with an external server 8 through an external network 9. For example, the in-vehicle unit 11 is a lighting, a navigation system, and a car stereo. The in-vehicle unit 11 is connected to the battery 2. The generator 13 generates power by driving the engine 12. The generator 13 is connected to the battery 2.

The control device 10 controls the entire vehicle 1, and includes a controller 101, a storage 102, a communication unit 103, and an operation unit 104. The control device 10 is connected to the BMU 3. The external server 8 includes a controller 81 and a communication unit 82. The controller 101 of the control device 10 is connected to the controller 81 of the external server 8 through the communication unit 103, the external network 9, and the communication unit 82. For example, when the vehicle 1 includes a navigation system including a touch panel, the operation unit 104 is the touch panel.

For example, each of the controller 101 and the controller 81 includes a central processing unit (CPU), a graphic processing unit (GPU), a read only memory (ROM), a random access memory (RAM), and the like, and controls the operation of the control device 10 and the external server 8. The storage 102 includes, for example, a nonvolatile semiconductor memory or a hard disk drive (HDD), and stores various programs and data. The communication unit 103, the communication unit 82, and a communication unit 34 (see FIG. 4) included in the BMU 3 have a function of communicating with another device through a network, and can transmit and receive necessary information.

Figure 2:
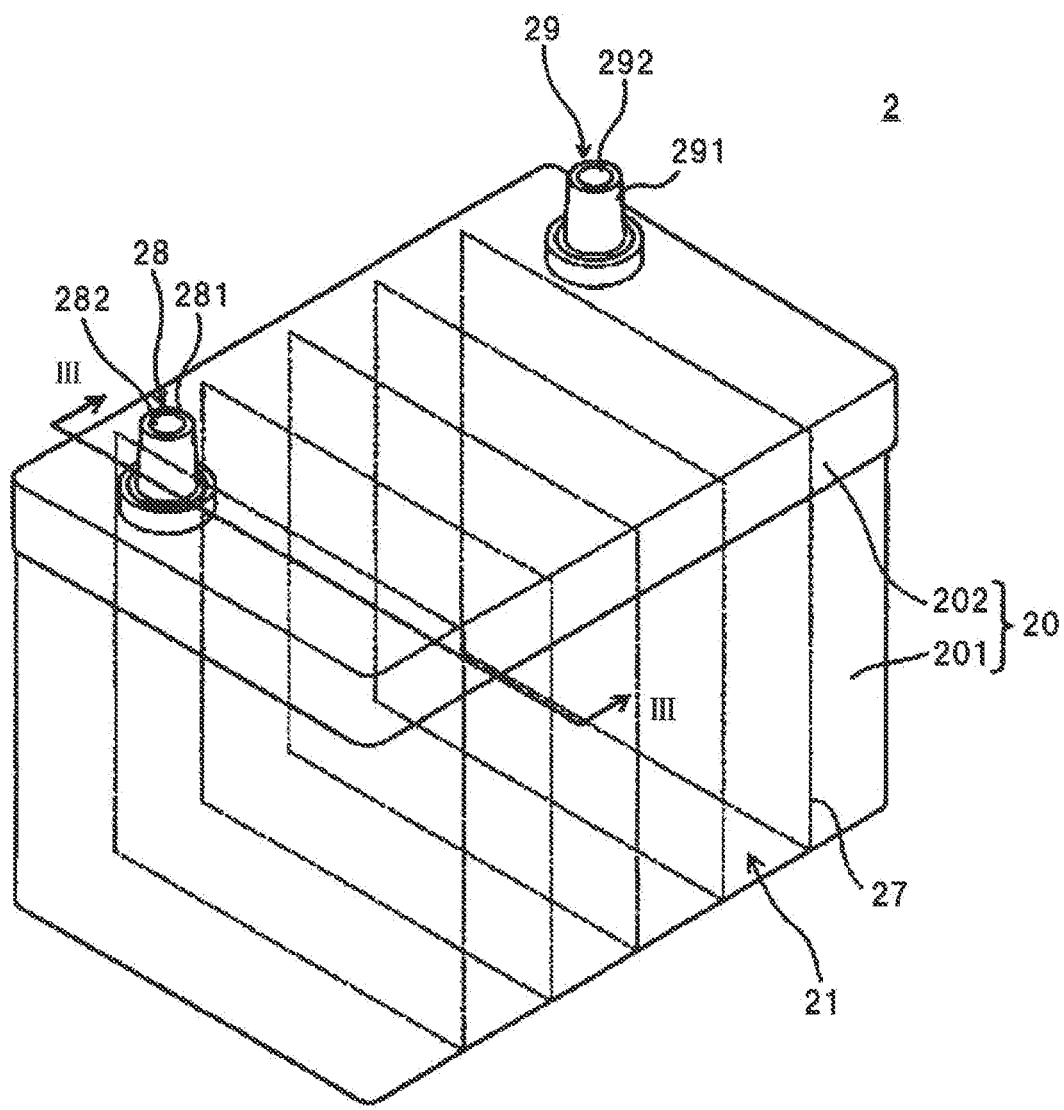
FIG. 2 is a perspective view illustrating an appearance configuration of a battery.
Figure 3:
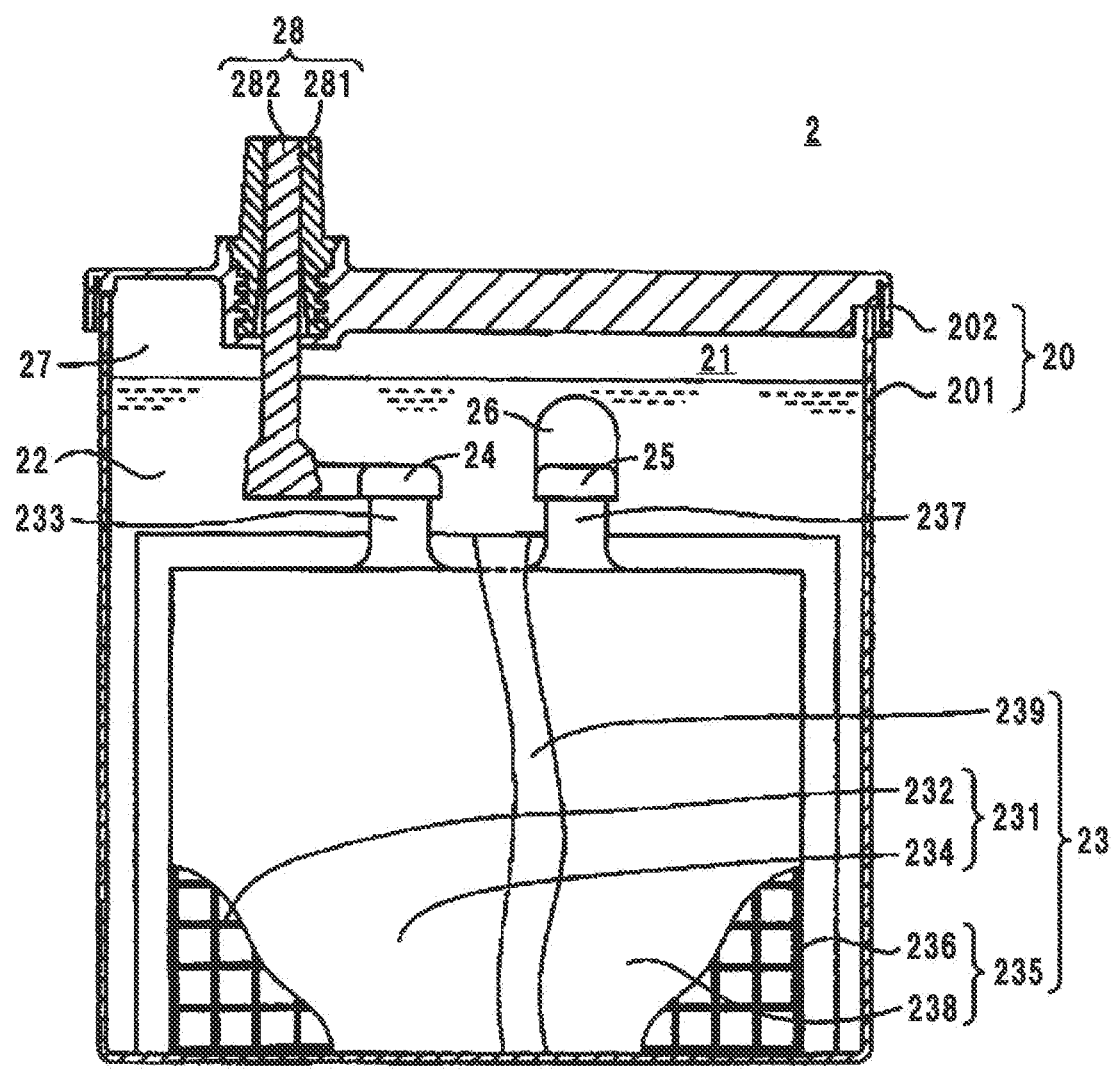
FIG. 3 is a sectional view taken along a line III-III of FIG. 2.

FIG. 2 is a perspective view illustrating an appearance configuration of the battery 2, and FIG. 3 is a sectional view taken along a line III-III of FIG. 2. As illustrated in FIGS. 2 and 3, the battery 2 includes a container 20, a positive electrode terminal 28, a negative electrode terminal 29, and a plurality of elements 23.

The container 20 includes a container body 201 and a lid 202. The container body 201 is a rectangular parallelepiped container in which an upper portion is opened, and for example, is formed of a synthetic resin or the like. For example, the lid 202 made of a synthetic resin closes the opening of the container body 201. For example, a peripheral edge portion of a lower surface of the lid 202 and a peripheral edge portion of the opening of the container body 201 are joined by thermal welding. A space in the container 20 is partitioned by a partition 27 into a plurality of cell chambers 21 arranged in a longitudinal direction of the container 20.

One element 23 is accommodated in each cell chamber 21 of the container 20. An electrolyte solution 22 containing dilute sulfuric acid is accommodated in each cell chamber 21 of the container 20, and the entire element 23 is immersed in the electrolyte solution 22. The electrolyte solution 22 is injected into the cell chamber 21 from an electrolyte solution filling port (not illustrated) provided in the lid 202.

The element 23 includes a plurality of positive electrode plates 231, a plurality of negative electrode plates 235, and a separator 239. The plurality of positive electrode plates 231 and the plurality of negative electrode plates 235 are alternately arranged.

The positive electrode plate 231 includes a positive electrode grid 232 and a positive electrode material 234 supported by the positive electrode grid 232. The positive electrode grid 232 is a conductive member including a bone arranged in a substantially grid shape or a mesh shape, and for example, is formed of lead or a lead alloy. The positive electrode grid 232 includes an ear 233 protruding upward near an upper end. The positive electrode material 234 contains lead dioxide. The positive electrode material 234 may further contain a known additive.

The negative electrode plate 235 includes a negative electrode grid 236 and a negative electrode material 238 supported by the negative electrode grid 236. The negative electrode grid 236 is a conductive member including a bone arranged in a substantially grid shape or a mesh shape, and for example, is formed of lead or a lead alloy. The negative electrode grid 236 includes an ear 237 protruding upward near the upper end. The negative electrode material 238 contains lead. The negative electrode material 238 may further contain a known additive.

For example, the separator 239 is formed of an insulating material such as glass or synthetic resin. The separator 239 is interposed between the positive electrode plate 231 and the negative electrode plate 235 adjacent to each other. The separator 239 may be configured as an integral member, or separately provided between the positive electrode plate 231 and the negative electrode plate 235. The separator 239 may be disposed so as to package either the positive electrode plate 231 or the negative electrode plate 235.

For example, the ears 233 of the plurality of positive electrode plates 231 are connected to a strap 24 formed of lead or a lead alloy. The plurality of positive electrode plates 231 are electrically connected in parallel through the straps 24. Similarly, for example, the ears 237 of the plurality of negative electrode plates 235 are connected to a strap 25 formed of lead or a lead alloy. The plurality of negative electrode plates 235 are electrically connected through the strap 25.

In the battery 2, the strap 25 in one cell chamber 21 is connected to the strap 24 in one cell chamber 21 adjacent to the one cell chamber 21 through an intermediate pole 26 formed of, for example, lead or a lead alloy. The strap 24 in the one cell chamber 21 is connected to the strap 25 in the other cell chamber 21 adjacent to the one cell chamber 21 through the intermediate pole 26. That is, the plurality of elements 23 of the battery 2 are electrically connected in series through the straps 24, 25 and the intermediate pole 26. For example, the intermediate pole 26 is inserted through an opening formed in the partition 27. The gap between the intermediate pole 26 and the edge of the opening of the partition 27 is closed by welding between a plate member (not illustrated) and the intermediate pole 26 and the partition 27. As illustrated in FIG. 3, the strap 24 accommodated in the cell chamber 21 located at one end in the longitudinal direction of the container 20 is connected to not the intermediate pole 26 but a positive electrode pole 282 described later. The strap 25 accommodated in the cell chamber 21 located at the other end in the longitudinal direction of the container 20 is connected to not the intermediate pole 26 but a negative pole (not illustrated).

The positive electrode terminal 28 is disposed at one end in the longitudinal direction of the container 20, and the negative electrode terminal 29 is disposed near the other end in the longitudinal direction of the container 20.

As illustrated in FIG. 3, the positive electrode terminal 28 includes a bushing 281 and the positive electrode pole 282. The bushing 281 is a substantially cylindrical conductive member, and for example, is made of a lead alloy. A lower portion of the bushing 281 is integrated with the lid 202 by insert molding, and an upper portion of the bushing 281 protrudes upward from an upper surface of the lid 202. The positive electrode pole 282 is a substantially cylindrical conductive member, and for example, is formed of a lead alloy. The positive electrode pole 282 is inserted into a hole of the bushing 281. The upper end of the positive electrode pole 282 is located at substantially the same position as the upper end of the bushing 281, and for example, joined to the bushing 281 by welding. The lower end of the positive electrode pole 282 protrudes downward from the lower end of the bushing 281, further protrudes downward from the lower surface of the lid 202, and is connected to the strap 24 accommodated in the cell chamber 21 located at one end in the longitudinal direction of the container 20. Similarly to the positive electrode terminal 28, the negative electrode terminal 29 includes a bushing 291 and a negative electrode pole 292 (see FIG. 2), and has the same configuration as the positive electrode terminal 28.

The in-vehicle unit 11 is connected to the bushing 281 of the positive electrode terminal 28 and the bushing 291 of the negative electrode terminal 29. The power is supplied from the battery 2 to the in-vehicle unit 11. That is, the battery 2 is discharged. The generator 13 is connected to the bushing 281 of the positive electrode terminal 28 and the bushing 291 of the negative electrode terminal 29. The battery 2 is charged by the power supplied from the generator 13 to the battery 2.

For example, when the positive electrode plate 231 and the negative electrode plate 235 are brought into contact with each other due to breakage of the separator 239 due to the degradation or the like, because electric resistance at a contact portion is small, a large current easily flows through the contact portion. That is, the internal short-circuit is generated in the battery 2. For example, when the positive electrode plate 231 or the negative electrode plate 235 is bent during manufacturing of the battery 2, the bent positive electrode plate 231 or negative electrode plate 235 comes into contact with the adjacent negative electrode plate 235 or positive electrode plate 231, so that the internal short-circuit is generated in the battery 2. When a conductive foreign material such as metal is mixed into the inside of the container 20 during the manufacturing of the battery 2, the internal short-circuit is generated in the battery 2 due to the contact between the foreign material and the positive electrode plate 231 and the negative electrode plate 235. Because the generation cause of bending of the positive electrode plate 231 or the negative electrode plate 235 or the internal short-circuit such as the foreign material is hardly detected by inspection during the manufacturing, there is a possibility that the internal short-circuit of the battery 2 is suddenly generated during use of the battery 2, for example, during traveling of the vehicle 1. When the internal short-circuit is generated, the battery 2 cannot supply the power to the electric load such the in-vehicle unit 11. For example, a welded portion between the plate member and the intermediate pole 26 and the partition 27 may be degraded, and there is a risk that the electrolyte solution 22 enters the gap between the intermediate pole 26 and the edge of the opening of the partition 27. When the electrolyte solution 22 enters the gap, the electrolyte solutions 22 accommodated in the adjacent cell chambers 21 come into contact with each other. Due to the contact between the electrolyte solutions 22 in the adjacent cell chambers 21, the positive electrode plate 231 of one cell chamber 21 and the negative electrode plate 235 in the cell chamber 21 adjacent to one cell chamber 21 are brought into contact with each other through the electrolyte solution 22, so that the internal short-circuit is generated in the battery 2. The internal short-circuit caused by the contact between the electrolyte solutions 22 in the adjacent cell chambers 21 is called a liquid junction.

As illustrated in FIG. 1, the vehicle 1 includes a voltage sensor 5, a current sensor 6, and a temperature sensor 7. The voltage sensor 5 is connected in parallel to the battery 2, and outputs a detection result corresponding to the entire voltage at the battery 2. The current sensor 6 is connected in series to the battery 2. The current sensor 6 outputs the detection result corresponding to the current (charge current) flowing from the generator 13 to the battery 2 and the detection result corresponding to the current (discharge current) flowing from the battery 2 to the in-vehicle unit 11. For example, the temperature sensor 7 is disposed near the battery 2, and outputs the detection result corresponding to the temperature of the battery 2.

Figure 4:
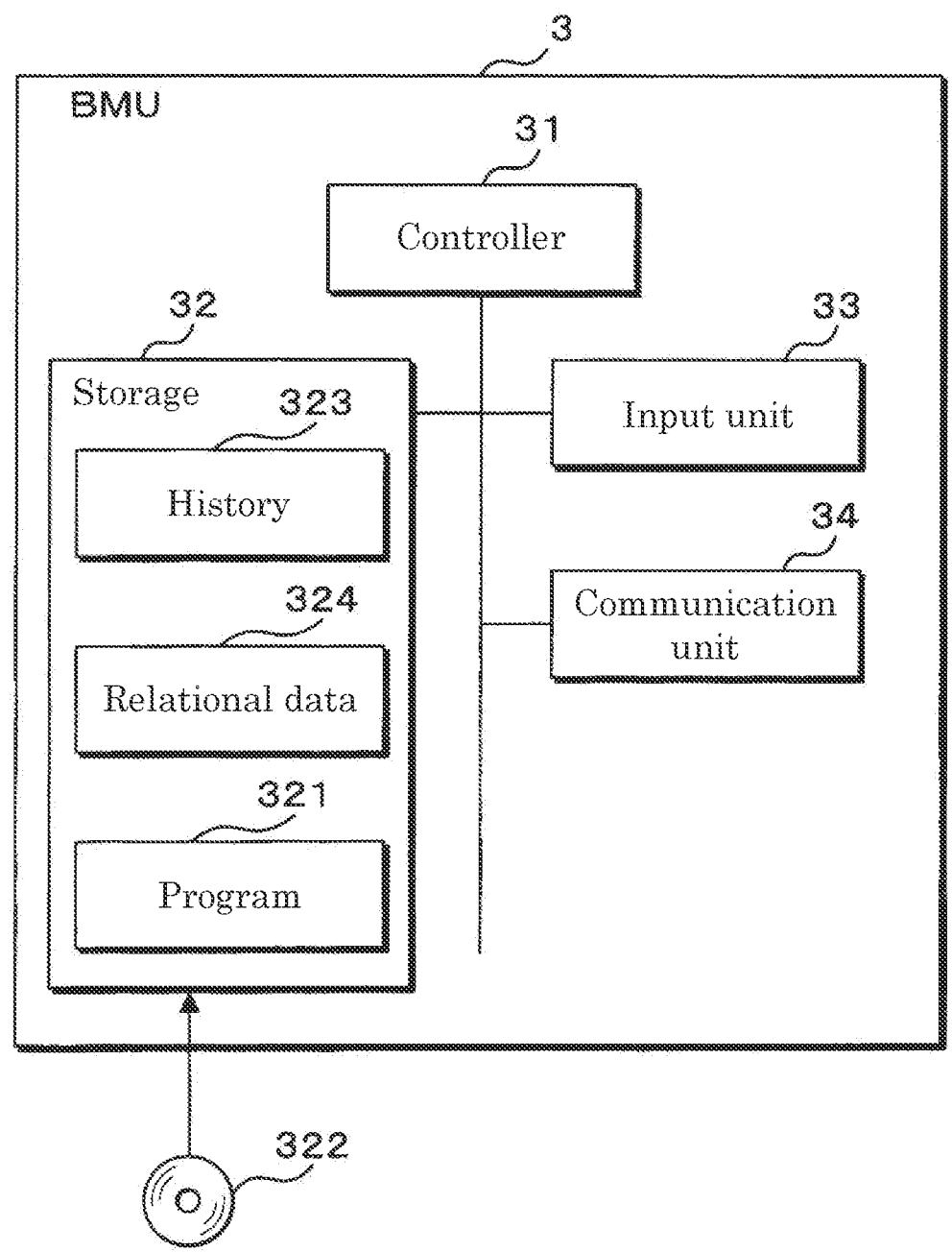
FIG. 4 is a block diagram illustrating a configuration of a BMU.

FIG. 4 is a block diagram illustrating a configuration of the BMU 3. The BMU 3 includes a controller 31, a storage 32, an input unit 33, and the communication unit 34. These units are communicably connected to each other through a bus. The input unit 33 receives an input of the detection result from the voltage sensor 5, the current sensor 6, and the temperature sensor 7. The communication unit 34 communicates with other devices such as the control device 10 and the external server 8.

For example, the storage 32 includes a nonvolatile semiconductor memory or an HDD, and stores various programs and data. For example, the storage 32 stores a program 321 executing an internal short-circuit generation estimating processing described later. The program 321 stored in the storage 32 may store the program 321 read from a recording medium 322 readable by the BMU 3. A history 323 is stored in the storage 32. FIG. 5 is a conceptual diagram illustrating a content example of the history 323. Although details will be described later, for example, the charge current, the discharge current, the voltage, and the temperature of the battery 2 acquired by the controller 31, the acquisition time, and the SOC, an amount of charge, a discharge capacity, and an overcharge amount derived by the controller 31 in the internal short-circuit generation estimating processing as described later are recorded the history 323.

For example, the controller 31 includes a CPU, a GPU, a ROM, a RAM, and the like, and controls the operation of the BMU 3 by executing a computer program such as the program 321 read from the storage 32. The controller 31 functions as a processing unit that executes the internal short-circuit generation estimating processing as described later by reading and executing the program 321.

The controller 31 acquires the voltage at the battery 2 from the voltage sensor 5 through the input unit 33. The controller 31 acquires the charge current and the discharge current from the current sensor 6 through the input unit 33. The controller 31 acquires the temperature of the battery 2 from the temperature sensor 7. The voltage, the charge current, the discharge current, and the temperature are acquired at the same time at a constant period, for example, every minute. The acquired voltage, the charge current, the discharge current, and the temperature are recorded in the history 323 in association with the acquired time.

The controller 31 derives an SOC of the battery 2. The SOC is an index representing a remaining capacity of the battery 2. The SOC [%] is represented by remaining capacity [Ah]/capacity in full charge state [Ah]×100. The SOC is known to be related to an OCV (open circuit voltage), and can be estimated from the OCV.

For example, map data is stored in the storage 32. The map data is data representing the SOC with respect to the OCV of the battery 2, is previously obtained by an experiment, is input to the BMU 3 through the communication unit 34, and is stored in the storage 32. For example, the map data is data representing an SOC-OCV curve. When deriving the SOC of the battery 2, the controller 31 acquires the OCV of the battery 2. When neither the charge current nor the discharge current flows through the battery 2, the controller 31 acquires the voltage at the battery 2 as the OCV. When the charge current and the discharge current flow through the battery 2, the controller 31 derives and acquires the OCV of the battery 2 from the detection result of the voltage sensor 5 by a known method in consideration of the voltage drop caused by the internal resistance of the battery 2. For example, a known method is a method using a Kalman filter. The controller 31 derives the SOC of the battery 2 using the acquired OCV of the battery 2 and the map data. The SOC is periodically derived at the same interval as the voltage acquisition interval. That is, the SOC is derived at the same interval as the acquisition of the charge current, the discharge current, and the temperature. The derived SOC is recorded in the history 323 in association with the time when the voltage used for the derivation is acquired.

A period from time t1 to time t2 is set to a period (estimation period) used for the internal short-circuit generation estimating processing as described later. The time t1 is a start point of the estimation period, and the time t2 is an end point of the estimation period (t2>t1). For example, the time t1 is time before sixty minutes from the time t2. A first SOC, which is the SOC at the start point of the estimation period, is the SOC at the time t1. A second SOC, which is the SOC at the end point of the estimation period, is the SOC at the time t2. The first SOC and the second SOC are derived by the controller 31.

The controller 31 derives a change amount of an electric quantity of the battery 2 based on a difference between the first SOC and the second SOC. Because the SOC is a ratio between a residual amount and the capacity in the fully charged state, the residual amount (the electric quantity of the battery 2) can be derived from the SOC and the capacity in the fully charged state. The capacity in the fully charged state of the battery 2 is known, for example, by the previously-performed experiment, and is stored in the storage 32. The controller 31 multiplies the capacity in the fully charged state of the battery 2 by the difference between the first SOC and the second SOC (second SOC−first SOC) to derive the change amount of the electric quantity of the battery 2 from the time t1 to the time t2 (estimation period).

The controller 31 derives the amount of charge and the discharge capacity of the battery 2 from the acquired charge current and discharge current. For example, when the period at which the current is acquired every one minute (1/60 hour), the controller 31 multiplies the acquired charge current [A] and discharge current [A] by the acquisition period 1/60 [h] to derive the amount of charge [Ah] and the discharge capacity [Ah]. Hereinafter, the amount of charge and the discharge capacity are also collectively referred to as a charge-discharge capacity. The derived charge-discharge capacity is recorded in the history 323 in association with the times of the charge current and the discharge current used for the derivation.

The controller 31 derives the overcharge amount that is a difference between the amount of charge and the discharge capacity (amount of charge−discharge capacity) based on the derived charge-discharge capacity. The derived overcharge amount is recorded in the history 323 in association with the time of the charge-discharge capacity used for the derivation. The controller 31 sums the overcharged amounts from the time t1 to the time t2 (estimation period) to derive a total amount of the overcharge amounts. The overcharge amount may be a positive value, zero, or a negative value. That is, the overcharge amount is zero when the vehicle is not used, and the overcharged amount is the negative value when the discharge capacity is larger than the amount of charge. However, when a dark current flowing through the electric load of the vehicle is taken into consideration, the overcharge amount is the negative value even when the vehicle is not used. Hereinafter, the total amount of the overcharge amount is also referred to as a total overcharge amount.

The controller 31 derives an actual measurement error (change amount of electric quantity of battery 2−total overcharge amount) between the change amount of the electric quantity of the battery 2 from the time t1 to the time t2 and the total overcharge amount from the time t1 to the time t2. That is, the controller 31 derives the actual measurement error based on the derived difference between the first SOC and the second SOC and the derived total amount of the overcharge amount. The actual measurement error has a relationship between the SOC (first SOC and second SOC) before and after the change in the electric quantity and the temperature. The reason why the actual measurement error has the relationship between the SOC (the first SOC and the second SOC) before and after the change in the electric quantity and the temperature is the consideration of an influence of a self-discharge amount because the self-discharge amount changes depending on the temperature. At this point, when the minute short-circuit that is a sign of the internal short-circuit is generated, the discharge current that is not acquired (detected) flows due to the minute short-circuit, so that the derived actual measurement error indicates an abnormal value deviating from the above relationship.

The controller 31 specifies the estimation error based on the derived first SOC, second SOC, and the acquired temperature, and the relationship between the first SOC, the second SOC, and the temperature of the lead-acid battery, and the estimation error derived based on the difference between the first SOC and the second SOC and the total amount of the overcharge amount. A method for specifying the estimation error will be described later.

The controller 31 specifies the abnormality degree of the derived actual measurement error based on the derived actual measurement error and the specified estimation error. For example, the abnormality degree of the actual measurement error is a degree to which the derived actual measurement error deviates from the relationship between the first SOC, the second SOC, and the temperature. The controller 31 estimates the generation of the internal short-circuit of the battery 2 based on the specified abnormality degree. A method for specifying the abnormality degree and a method for estimating the generation of the internal short-circuit of the battery 2 will be described later.

The BMU 3 functions as the estimation device. The BMU 3 functions as the acquisition unit, the first deriving unit, the second deriving unit, the third deriving unit, the first specification unit, the second specification unit, and the estimation unit. The control device 10 or the external server 8 may function as the estimation device. When the external server 8 does not function as the estimation device, the external server 8 may not be connected to the control device 10.

Figure 6:
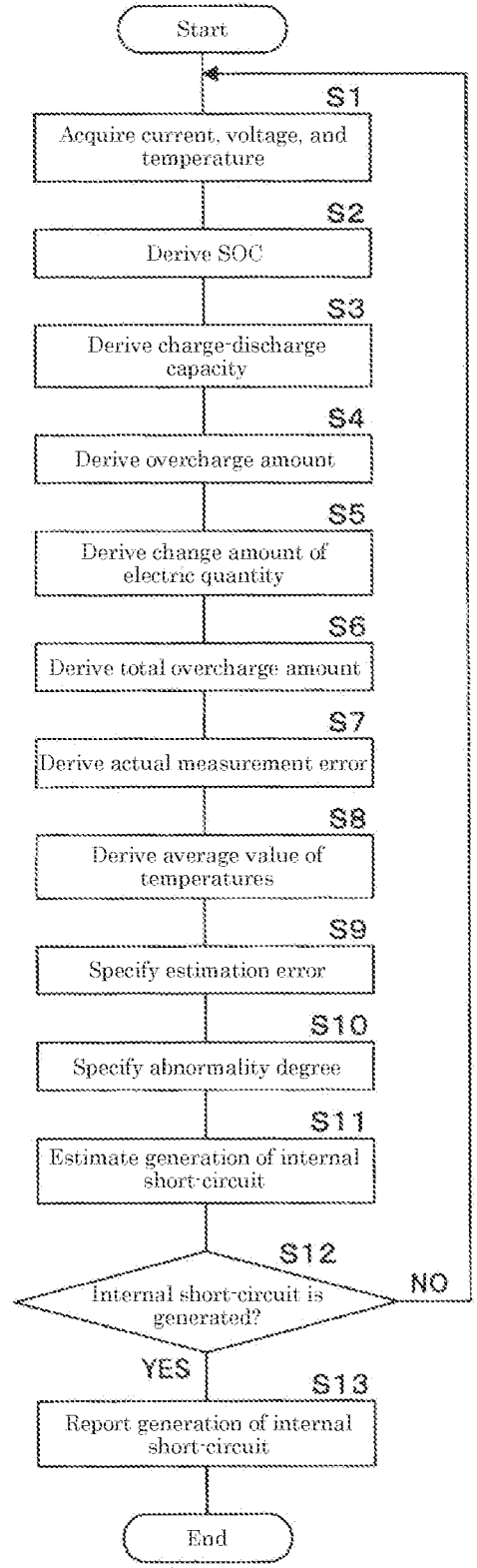
FIG. 6 is a flowchart illustrating a procedure of internal short-circuit generation estimating processing performed by a controller of the BMU.

FIG. 6 is a flowchart illustrating a procedure of the internal short-circuit generation estimating processing performed by the controller 31 of the BMU 3. Hereinafter, the step is abbreviated as S. For example, when an ignition switch (not illustrated) of the vehicle 1 is turned on, the controller 31 executes the following processing according to the program 321.

The controller 31 acquires the charge current and the discharge current of the battery 2, the voltage at the battery 2, and the temperature of the battery 2 at the same time every constant period, for example, every one minute (S1). In FIG. 6, the charge current and the discharge current are collectively referred to as a current. The acquired charge current and discharge current of the battery 2, the voltage at the battery 2, and the temperature of the battery 2 are recorded in the history 323 in association with the acquired time.

The controller 31 derives the SOC of the battery 2 from the acquired voltage and the relationship between the SOC and the OCV (S2). For example, as described above, the controller 31 derives the SOC of the battery 2 from the acquired voltage and the map data of the storage 32. The derived SOC is recorded in the history 323 in association with the time when the voltage used for the derivation is acquired. The SOC is derived at the same interval as the voltage acquisition interval.

The controller 31 derives the charge-discharge capacity (amount of charge and discharge capacity) of the battery 2 from the acquired charge current and discharge current (S3). The acquired charge-discharge capacity is recorded in the history 323 in association with the time when the charge current and the discharge current used for the derivation are acquired. The controller 31 derives the overcharge amount from the derived charge-discharge capacity (S4). The derived overcharge amount is recorded in the history 323 in association with the time of the charge-discharge capacity used for the derivation.

The controller 31 derives the change amount of the electric quantity of the battery 2 from the time t1 to the time t2 based on the difference between the SOC (first SOC) at the time t1 and the SOC (second SOC) at the time t2 (S5). For example, the time t2 is the latest time. The time t1 is a time before the time t2, for example, a time before sixty minutes from the time t2. The controller 31 derives the change amount of the electric quantity of the battery 2 from the time t1 to the time t2 from the difference between the first SOC and the second SOC and the capacity in the fully charged state of the battery 2 stored in storage 32. The derived change amount of the electric quantity is stored in the storage 32.

The controller 31 sums the overcharge amounts from the time t1 to the time t2 to derive the total overcharge amount from the time t1 to the time t2 (S6). The derived total overcharge amount is stored in the storage 32. The controller 31 derives the actual measurement error between the derived change amount of the electric quantity of the battery 2 and the derived total overcharge amount (S7). The derived actual measurement error is stored in the storage 32. The controller 31 derives an average value of temperatures of the battery 2 between the time t1 and the time t2 (S8). The controller 31 may derive the average value of the temperature at the time t1 and the temperature at the time t2. The derived average value of the temperatures is stored in the storage 32.

The controller 31 specifies the estimation error (S9). An example in which the controller 31 specifies the estimation error will be described below. Relational data 324 is stored in the storage 32. The relational data 324 is data representing the relationship among the estimation error, the first SOC, the second SOC, and the temperature, and for example, is previously obtained by an experiment. FIG. 7 is a conceptual diagram illustrating a content example of the relational data 324. The experiment is performed using the battery 2 in which the internal short-circuit and the minute short-circuit are not generated, for example, the new battery 2. In the experiment, the SOC, the charge-discharge capacity, and the temperature of the battery 2 are acquired during the charge-discharge of the battery 2. This acquisition is performed a plurality of times. The change amount of the electric quantity of the battery 2 at a certain time during the charge-discharge is derived from each acquired SOC and the capacity in the fully charged state of the battery 2. The total overcharge amount at a certain time during the charge-discharge is derived from the acquired charge-discharge capacity. The average value of the temperature of the battery 2 at a certain time during the charge-discharge is derived. The difference between the change amount of the electric quantity of the battery 2 derived in the experiment and the total overcharge amount derived in the experiment is derived as the estimation error (the change amount of the electric quantity of the battery 2–the total overcharge amount). These acquisition and derivation are performed for a plurality of times during the charge-discharge. Two SOCs (the first SOC and the second SOC) used for deriving the change amount of the electric quantity, the average value of temperatures, and the estimation error in the respective charge-discharge times are recorded in the relational data 324. The function of the first SOC, the second SOC, and the average value of the temperature with respect to the estimation error may be derived from the data obtained in the experiment by, for example, a least squares method. The function may be stored in the storage 32 as the relational data 324. In S9, the controller 31 specifies the estimation error from the SOC (first SOC) at the time t1 and the SOC (second SOC) at the time t2, the average value of the temperatures derived in S8, and the relational data 324.

The controller 31 specifies the abnormality degree of the derived actual measurement error (S10). An example in which the abnormality degree of the actual measurement error derived by the controller 31 is specified will be described below. When the minute short-circuit that is the sign of the internal short-circuit is generated, the actual measurement error becomes larger or smaller than the estimation error. For example, the controller 31 specifies a ratio between the actual measurement error and the estimation error (actual measurement error/estimation error) as the abnormality degree of the actual measurement error.

The controller 31 estimates the generation of the internal short-circuit of the battery 2 based on the specified abnormality degree (11). For example, when the abnormality degree of the actual measurement error is within a certain range, for example, greater than or equal to 0.8 and less than or equal to 1.2, the controller 31 estimates that the internal short-circuit is not generated in the battery 2. When estimating that the internal short-circuit is not generated in the battery 2 (NO in S12), the controller 31 performs the processing of S1. For example, when the abnormality degree of the actual measurement error is out of a certain range, for example, less than 0.8 or greater than 1.2, the controller 31 estimates that the internal short-circuit is generated in the battery 2. When estimating that the internal short-circuit is generated in the battery 2 (YES in S12), the controller 31 notifies a person in the vehicle 1, for example, a driver of the vehicle 1 that the internal short-circuit is generated (S13), and ends the processing. For example, the controller 31 displays a message such as "The battery may be short-circuited. Please replace the battery." on the display of the navigation system included in the vehicle 1 through the communication unit 34. For example, the message is stored in the storage 32. The message may be included in the program 321.

The abnormality degree of the actual measurement error is specified based on the actual measurement error and the estimation error. The generation of the internal short-circuit can be previously estimated based on the specified abnormality degree.

Second Embodiment

Figure 8:
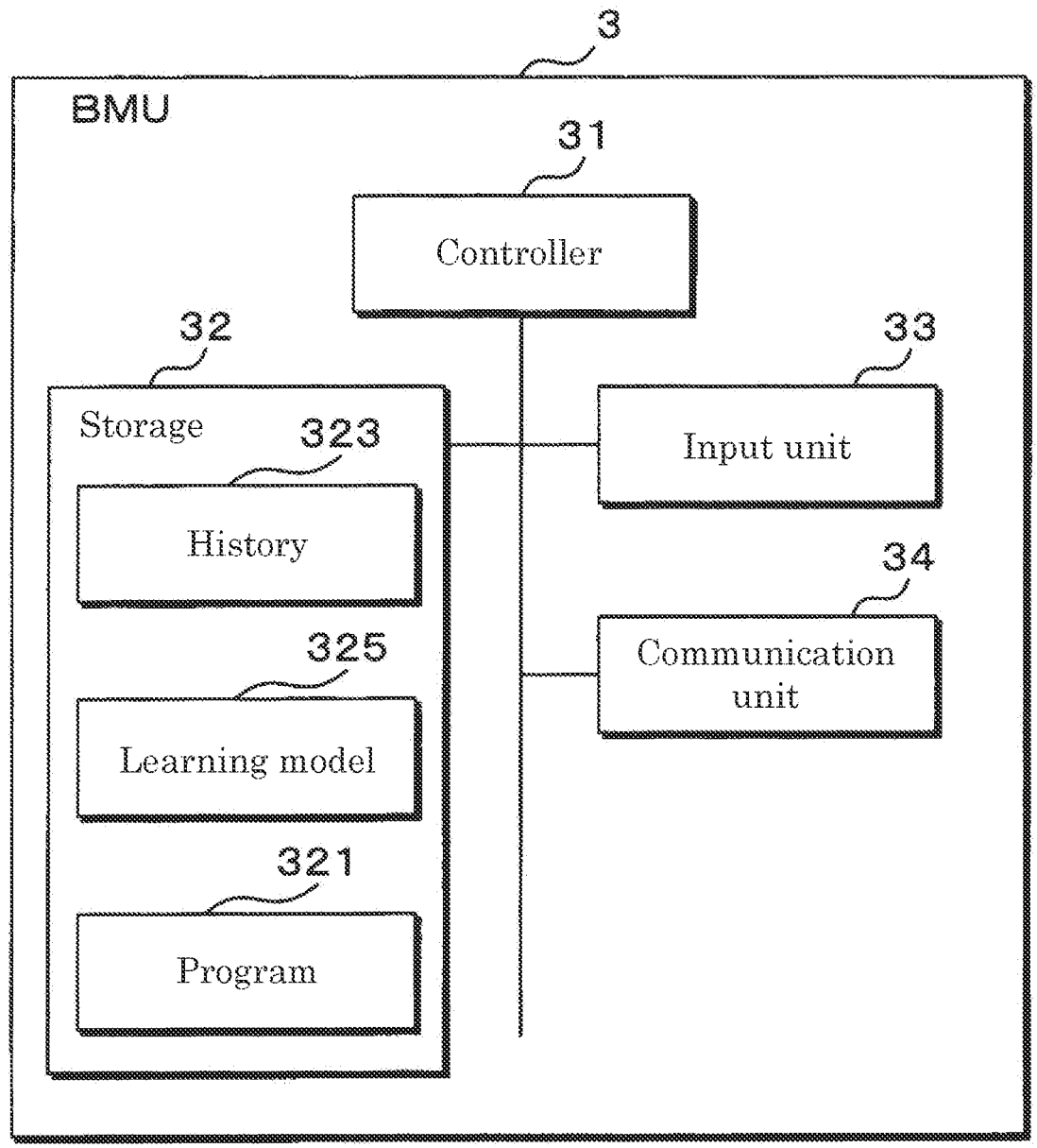
FIG. 8 is a block diagram illustrating a configuration of a BMU according to a second embodiment.

FIG. 8 is a block diagram illustrating a configuration of the BMU 3 according to a second embodiment. In the configuration according to the second embodiment, the same component as that of the first embodiment is denoted by the same reference numeral, and the detailed description thereof will be omitted.

In the second embodiment, a learning model 325 is stored in the storage 32 of the BMU 3. The learning model 325 outputs the abnormality degree of the actual measurement error when the actual measurement error, the first SOC, the second SOC, and the temperature are input. The controller 31 estimates the generation of the internal short-circuit of the lead-acid battery based on the output abnormality degree.

When the actual measurement error, the first SOC, the second SOC, and the temperature are input, the learning model 325 outputs the abnormality degree of the actual measurement error, for example, a probability that the actual measurement error is abnormal and a probability that the actual measurement error is not abnormal. For example, the temperature is an average value of the temperatures from the time t1 to the time t2, and may be an average value of the temperature at the time t1 and the temperature at the time t2. For example, a multilayer convolutional neural network (CNN) learned by deep learning can be used as the learning model 325. A neural network other than the CNN, for example, a recurrent neural network (RNN) may be used as the learning model 325. The learning model 325 may be learned by another machine learning.

Figure 9:
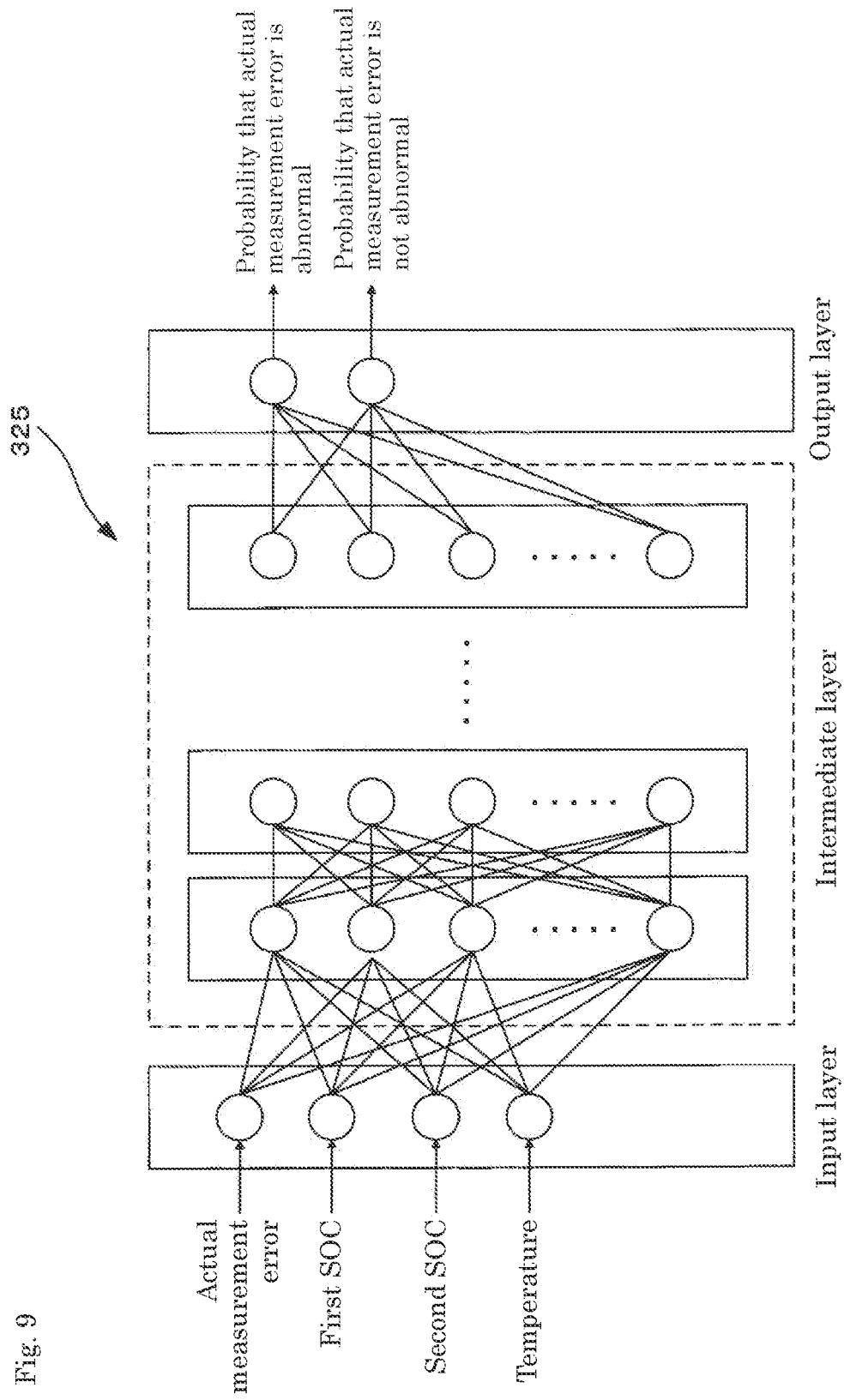
FIG. 9 is a schematic diagram of a learning model.

FIG. 9 is a schematic diagram of the learning model 325. The learning model 325 includes an intermediate layer between an input layer and an output layer. The intermediate layer includes a multi-stage convolution layer and pooling layer, and a final-stage fully connected layer. The numbers of convolution layers, pooling layers, and fully connected layers can be appropriately determined. One or a plurality of nodes exist in each of the input layer, the intermediate layer, and the output layer. A node of each layer is coupled with a node existing in the preceding and subsequent layers in one direction with a desired weight and bias. The data input to each node of the input layer is input to the first intermediate layer. In this intermediate layer, the output is calculated using an activation function including the weight and the bias. The calculated output is input to the next intermediate layer. Hereinafter, similarly the output of the intermediate layer is successively transmitted to the subsequent layer until the output of the output layer is obtained.

The learning model 325 receives the actual measurement error, the first SOC, the second SOC, and the temperature as inputs, and outputs the abnormality degree of the actual measurement error, for example, the probability that the actual measurement error is abnormal and the probability that the actual measurement error is not abnormal. The probability that each output node of the output layer outputs is a value of 0 to 1.0.

For example, the output layer outputs the probability that the actual measurement error is abnormal . . . 0.91, and the probability that the actual measurement error is not abnormal . . . 0.09.

The learning model 325 is a model in which the abnormality degree of the actual measurement error, for example, the probability that the actual measurement error is abnormal and the probability that the actual measurement error is not abnormal are output when the actual measurement error, the first SOC, the second SOC, and the temperature are input using a teacher data 326.

FIG. 10 is a conceptual diagram illustrating a content example of the teacher data 326. For example, the teacher data 326 is produced by a previously-performed experiment. The experiment is performed using the battery 2 in which the internal short-circuit and the minute short-circuit are not generated and the battery 2 in which the internal short-circuit or the minute short-circuit is generated. In the experiment, the SOC, the charge-discharge capacity, and the temperature of each battery 2 are acquired during the charge-discharge of the battery 2. The SOC, the charge-discharge capacity, and the temperature of the battery 2 are acquired a plurality of times. The change amount of the electric quantity of each battery 2 at a certain time during the charge-discharge is derived from each acquired SOC and the capacity in the fully charged state of the battery 2. The total overcharge amount at a certain time during the charge-discharge is derived from the acquired charge-discharge capacity. The average value of the temperature of the battery 2 at a certain time during the charge-discharge is derived. The actual measurement error between the derived change amount of the electric quantity of the battery 2 and the derived total overcharge amount is derived. These acquisition and derivation are performed for a plurality of times during the charge-discharge. In the teacher data 326, the generation of the internal short-circuit or the minute short-circuit of the battery 2 used, the two SOCs (the first SOC and the second SOC) used for deriving the change amount of the electric quantity in each time during the charge-discharge, the average value of the temperature, and the actual measurement error are recorded for each identification (ID) number. Hereinafter, the generation of the internal short-circuit or the minute short-circuit is also referred to as the generation of the short circuit. The generation of the short circuit is recorded as "nothing" in the ID number of the data acquired using the battery 2 in which the internal short-circuit and the minute short-circuit are not generated. The generation of the short circuit is recorded as "existing" in the ID number of the data acquired using the battery 2 in which the internal short-circuit or the minute short-circuit is generated.

An example of learning of the learning model 325 will be described. The learning model 325 is a model learned by a learning device configured by a computer such as a personal computer (PC). The learning device may be the control device 10 or the external server 8. The learning model 325 and the teacher data 326 are stored in the learning device. In the teacher data 326, correct values of the probability that the actual measurement error is abnormal and the probability that the actual measurement error is not abnormal are given for each ID number. For example, in an ID number (1) of FIG. 10, the generation of the short circuit is existing. Because the actual measurement error of the battery 2 in which the internal short-circuit or the minute short-circuit is generated is the abnormal value, 1.0 is given to the ID number (1) as the correct value of the probability that the actual measurement error is abnormal. In the ID numbers other than the ID number (1) in which the generation of the short circuit is existing, 1.0 is given as the correct value of the probability that each actual measurement error is abnormal. 0 is given to the ID number (1) as the correct value of the probability that the actual measurement error is not abnormal. In the ID numbers other than the ID number (1) in which the generation of the short circuit is existing, 0 is given as the correct value of the probability that each actual measurement error is not abnormal. In an ID number (2), the generation of the short circuit is nothing. Because the actual measurement error of the battery 2 in which the internal short-circuit and the minute short-circuit are not generated is not the abnormal value, 1.0 is given to the ID number (2) as the correct value of the probability that the actual measurement error is not abnormal. In the ID number other than the ID number (2) in which the generation of the short circuit is nothing, 1.0 is given as the correct value of the probability that each actual measurement error is not abnormal. 0 is given to the ID number (2) as the correct value of the probability that the actual measurement error is abnormal. In the ID number other than the ID number (2) in which the generation of the short circuit is nothing, 0 is given as the correct value of the probability that each actual measurement error is abnormal.

The learning device inputs the actual measurement error of the ID number (1), the first SOC, the second SOC, and the average value of the temperature to the input layer of the learning model 325. Through the calculation processing in the intermediate layer, the probability that the actual measurement error is abnormal and the probability that the actual measurement error is not abnormal are output from the output layer. The learning device compares each of the probability that the output actual measurement error is abnormal and the probability that the actual measurement error is not abnormal with the correct value of the ID number (1). The learning device optimizes various parameters such as the weight and the bias that couple nodes used for calculation processing in the intermediate layer such that the probability that the actual measurement error output from the output layer is abnormal and the probability that the actual measurement error is not abnormal approach the correct value. The learning device similarly inputs the actual measurement error, the first SOC, the second SOC, and the average value of the temperature to the input layer with respect to the information after the ID number (2). The learning device optimizes the parameter by comparing each of the probability that the output actual measurement error is abnormal and the probability that the actual measurement error is not abnormal with the correct value of the same ID number as the input. The parameter optimization method is not particularly limited, but for example, the learning device optimizes various parameters using an error back propagation method (back propagation). The learning device optimizes the parameters, whereby the learning of the learning model 325 is performed.

For example, after learned by the learning device, the learning model 325 is recorded in the storage medium readable by the BMU 3. The learning model 325 read from the storage medium by the BMU 3 is stored in the storage 32. For example, the learning model 325 may be downloaded from the external server 8 and stored in the storage 32.

The BMU 3 functions as the estimation device. The BMU 3 functions as the acquisition unit, the first deriving unit, the second deriving unit, the third deriving unit, the specification unit, and the estimation unit.

The control device 10 or the external server 8 may function as the estimation device. When the external server 8 does not function as the estimation device, the external server 8 may not be connected to the control device 10.

Figure 11:
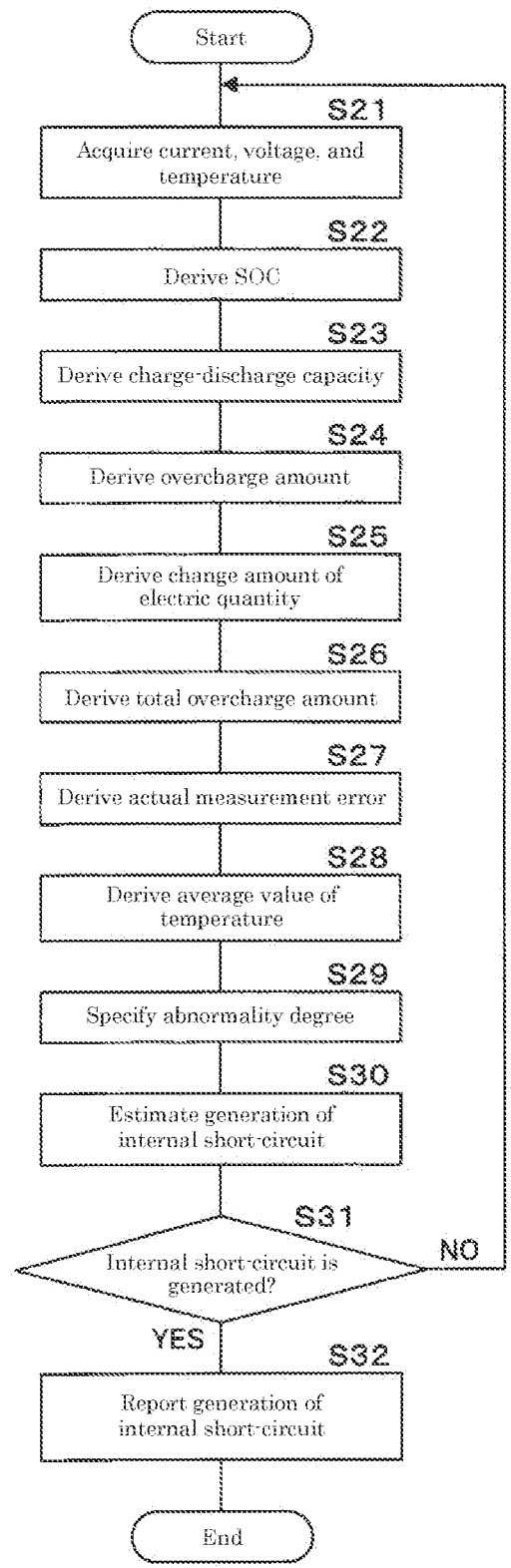
FIG. 11 is a flowchart illustrating a procedure of internal short-circuit generation estimating processing performed by a controller of the BMU.

FIG. 11 is a flowchart illustrating a procedure of the internal short-circuit generation estimating processing performed by the controller 31 of the BMU 3. Hereinafter, the step is abbreviated as S. In FIG. 11, the charge current and the discharge current are collectively referred to as a current. For example, when the ignition switch of the vehicle 1 is turned on, the controller 31 executes the following processing according to the program 321.

Because the pieces of processing from S21 to S28 are similar to the pieces of processing from S1 to S8 of the first embodiment, the description thereof will be omitted. The controller 31 specifies the abnormality degree of the actual measurement error (S29). The controller 31 inputs the derived actual measurement error, the first SOC, the second SOC, and the average value of the temperatures to the learning model 325. The probability that the actual measurement error is abnormal and the probability that the actual measurement error is not abnormal are output as the abnormality degree by the learning model 325, and the abnormality degree of the actual measurement error is specified.

The controller 31 estimates whether the internal short-circuit is generated in the battery 2 based on the specified abnormality degree (S30). For example, when the probability that the actual measurement error is abnormal is greater than or equal to the probability that the actual measurement error is not abnormal, the controller 31 estimates that the internal short-circuit is generated in the battery 2. When the probability that the actual measurement error is not abnormal is larger than the probability that the actual measurement error is abnormal, the controller 31 estimates that the internal short-circuit is not generated in the battery 2. When the controller 31 estimates that the internal short-circuit is not generated in the battery 2 (NO in S31), the processing in S21 is performed. When the controller 31 estimates that the internal short-circuit is generated in the battery 2 (YES in S31), the processing in S32 is performed, and then the processing is ended. Because the processing in S32 is similar to the processing in S13, the description thereof will be omitted.

The abnormality degree is specified using the learning model 325 that outputs the abnormality degree of the actual measurement error, for example, the probability that the actual measurement error is abnormal and the probability that the actual measurement error is not abnormal when the actual measurement error, the first SOC, the second SOC, and the temperature are input. The abnormality degree of the actual measurement error can be accurately specified. The generation of the internal short-circuit can be previously estimated based on the abnormality degree of the specified actual measurement error.

Third Embodiment

Figure 12:
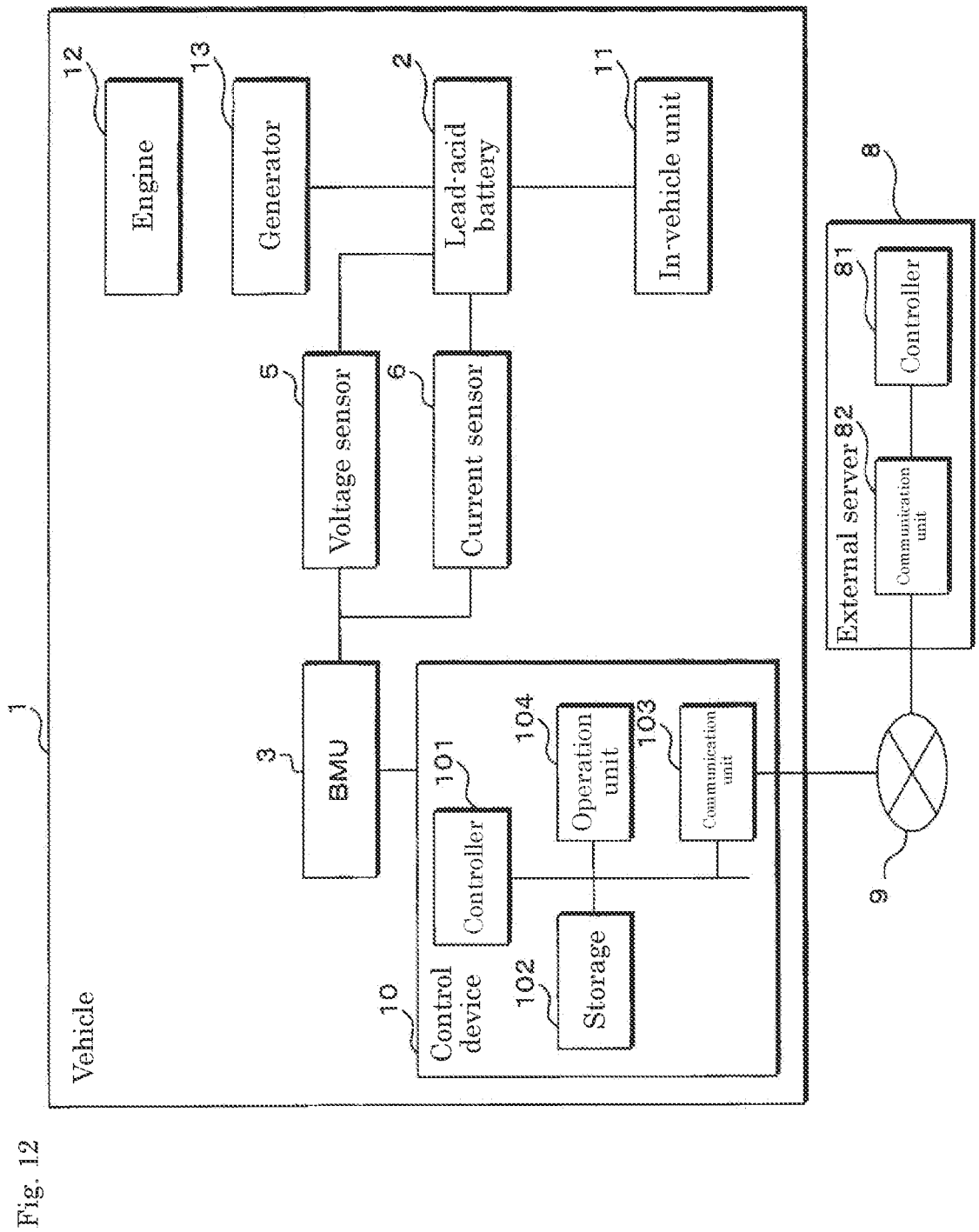
FIG. 12 is a block diagram illustrating a configuration of a vehicle according to a third embodiment.
Figure 13:
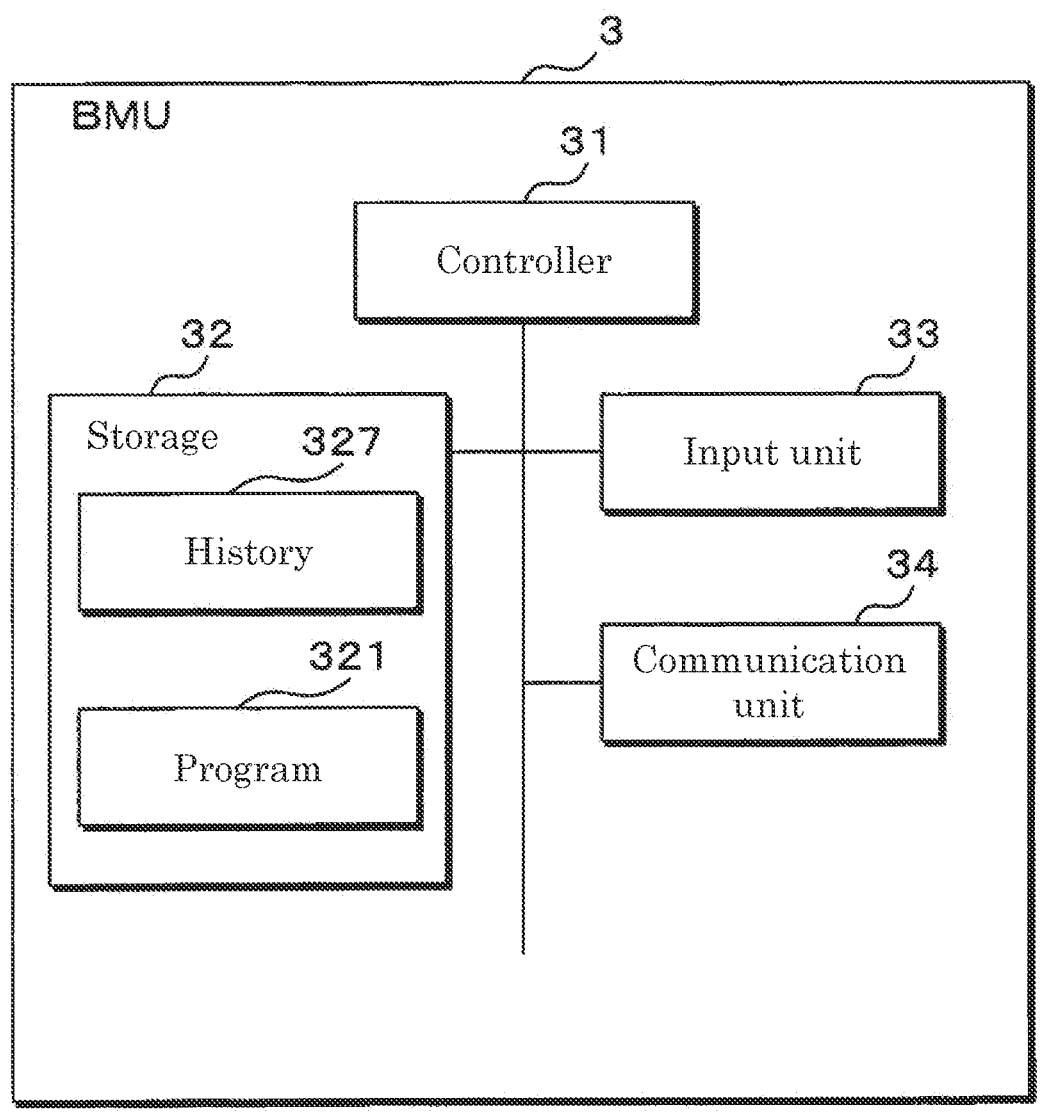
FIG. 13 is a block diagram illustrating a configuration of a BMU of the third embodiment.

FIG. 12 is a block diagram illustrating a configuration of the vehicle 1 according to a third embodiment. FIG. 13 is a block diagram illustrating a configuration of the BMU 3 of the third embodiment. In the configuration of the third embodiment, the same component as that of the first embodiment is denoted by the same reference numeral, and the detailed description thereof will be omitted.

Similarly to the first embodiment, the vehicle 1 includes the voltage sensor 5 and the current sensor 6. The storage 32 stores a history 327. FIG. 14 is a conceptual diagram illustrating a content example of the history 323. Although details will be described later, for example, a charge current, a discharge current, a voltage, and the charge-discharge capacity of the battery 2 that are acquired by the controller 31 in the internal short-circuit generation estimating processing as described later and an acquisition time are recorded in the history 327. A charge-discharge ratio, an average value of the charge-discharge ratio, and an average voltage that are derived by the controller 31 in the internal short-circuit generation estimating processing as described later are further recorded in the history 327.

The controller 31 acquires the voltage, the charge current, and the discharge current at the same time at a constant cycle, for example, every one minute. The acquired voltage, the charge current, and the discharge current are recorded in the history 327 in association with the acquired time. The controller 31 derives and acquires the charge-discharge capacity from the charge current and the discharge current. The acquired charge-discharge capacity is recorded in the history 327 in association with the time of the charge current and the discharge current used for the derivation. The controller 31 derives a charge-discharge ratio (amount of charge/discharge capacity), which is a ratio of the charge-discharge capacities, based on the derived charge-discharge capacity. The derived charge-discharge ratio is recorded in the history 327 in association with the time of the charge-discharge capacity used for the derivation.

The controller 31 estimates the generation of the internal short-circuit of the lead-acid battery based on at least one of the charge-discharge ratio and the voltage. An estimation method will be described later.

The BMU 3 functions as the estimation device. The BMU 3 functions as the acquisition unit and the estimation unit. The control device 10 or the external server 8 may function as the estimation device. When the external server 8 does not function as the estimation device, the external server 8 may not be connected to the control device 10.

Figure 15:
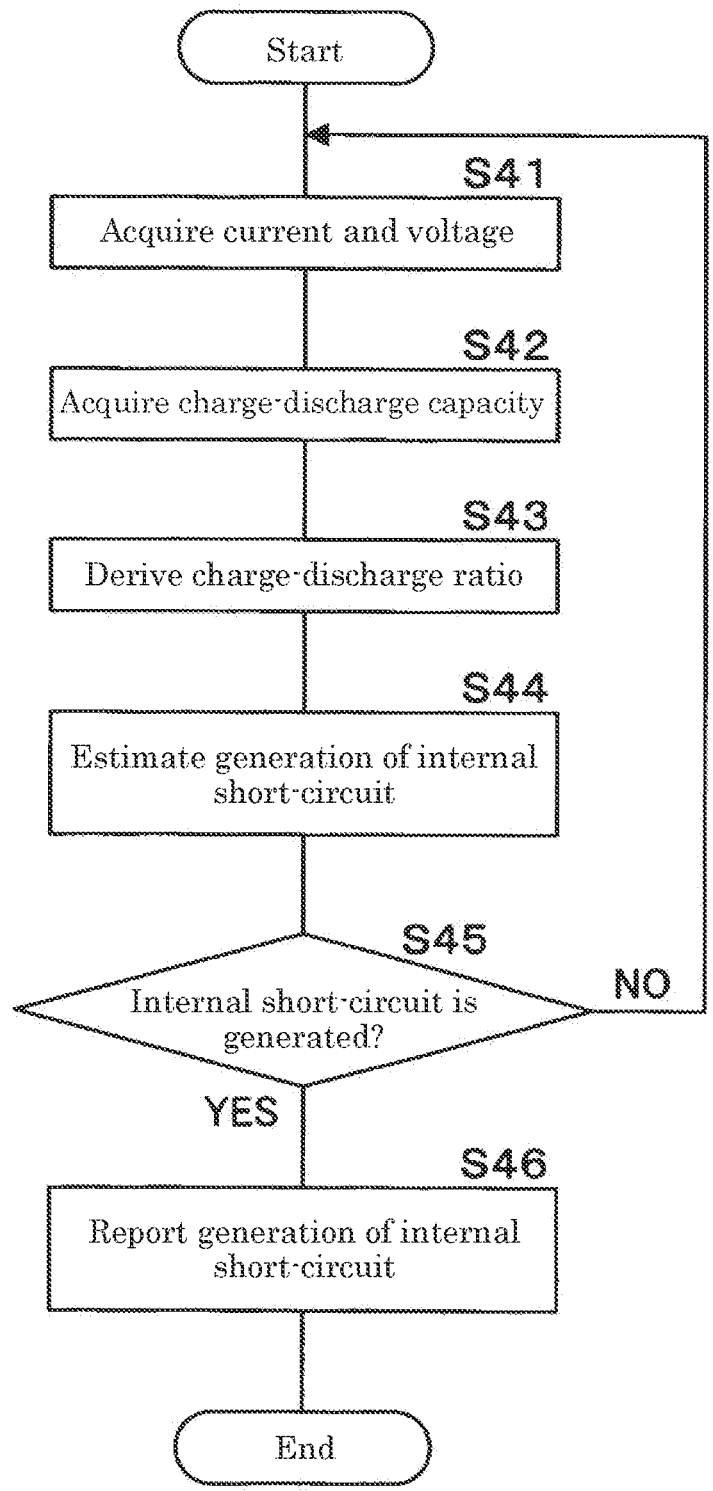
FIG. 15 is a flowchart illustrating a procedure of internal short-circuit generation estimating processing performed by a controller of the BMU.

FIG. 15 is a flowchart illustrating a procedure of the internal short-circuit generation estimating processing performed by the controller 31 of the BMU 3. Hereinafter, the step is abbreviated as S. For example, when the ignition switch of the vehicle 1 is turned on, the controller 31 of the BMU 3 executes the following processing according to the program 321.

The controller 31 acquires the charge current and the discharge current of the battery 2 and the voltage at the battery 2 at the same time in a constant period, for example, every one minute (S41). In FIG. 15, the charge current and the discharge current are collectively referred to as a current. The acquired charge current and discharge current of the battery 2 and the voltage at the battery 2 are recorded in the history 327 in association with the acquired time.

The controller 31 derives and acquires the charge-discharge capacity (amount of charge and discharge capacity) of the battery 2 from the acquired charge current and discharge current (S42). The acquired charge-discharge capacity is recorded in the history 327 in association with the time at which the charge current and the discharge current used for the derivation are acquired. The controller 31 derives the charge-discharge ratio based on the acquired charge-discharge capacity (S43). The derived charge-discharge ratio is recorded in the history 327 in association with the time of the charge-discharge capacity used for the derivation.

The controller 31 estimates whether the internal short-circuit is generated in the battery 2 based on at least one of the derived charge-discharge ratio and the acquired voltage (S44). An example in which the controller 31 estimates the generation of the internal short-circuit of the battery 2 based on the charge-discharge ratio will be described. When the minute short-circuit, which is a precursor of the internal short-circuit, is generated in the battery 2, the discharge current that is not detected flows through a portion where the minute short-circuit is generated, so that the amount of charge is larger than the discharge capacity. That is, the charge-discharge ratio is large. The controller 31 derives the average value of the charge-discharge ratios recorded in the history 327 for a certain period of time, for example, every thirty minutes. The derived average value of the charge-discharge ratios is recorded in the history 327. When the derived average value of the charge-discharge ratios is a constant value, for example, greater than or equal to 1.3, the controller 31 estimates that the internal short-circuit is generated. When the average value of the charge-discharge ratios is less than the constant value, the controller 31 estimates that the internal short-circuit is not generated.

An example in which the generation of the internal short-circuit of battery 2 is estimated based on the voltage will be described. When the minute short-circuit is generated in the battery 2, the voltage at the battery 2 is likely to decrease. The controller 31 derives the average value (average voltage) of the voltage recorded in the history 327 for a certain period of time, for example, every thirty minutes. The derived average voltage is recorded in the history 327. The controller 31 derives the difference between the derived average voltage and the previous derived average voltage. For example, the controller 31 derives the difference between the average voltage at the time from sixty-one minutes to ninety minutes and the average voltage at the time from thirty-one minutes to sixty minutes. When the difference between the derived average voltages is a constant value, for example, greater than or equal to 0.2 V, the controller 31 estimates that the internal short-circuit is generated. When the difference between the derived average voltages is less than the constant value, the controller 31 estimates that the internal short-circuit is not generated.

The controller 31 may estimate the generation of the internal short-circuit of the battery 2 based only on the derived charge-discharge ratio, or estimate the generation of the internal short-circuit of the battery 2 based only on the acquired voltage. In this case, in S41, the controller 31 acquires one of the charge current and the discharge current of the battery 2 and the voltage at the battery 2. When the generation of the internal short-circuit of the battery 2 is estimated based only on the voltage acquired by the controller 31, S42 and S43 are unnecessary. The controller 31 may estimate the generation of the internal short-circuit of the battery 2 based on both the derived charge-discharge ratio and the acquired voltage. When the generation of the internal short-circuit cannot be estimated by the estimation performed based on one of the derived charge-discharge ratio and the acquired voltage, the generation of the internal short-circuit can be estimated by the estimation performed based on the other, so that the generation of the internal short-circuit can be more reliably estimated.

When the controller 31 estimates that the internal short-circuit is not generated in the battery 2 (NO in S45), the processing in S41 is performed. When the controller 31 estimates that the internal short-circuit is generated in the battery 2 (YES in S45), the processing in S46 is performed, and then the processing is ended. Because the processing in S46 is similar to the processing in S13, the description thereof will be omitted.

The controller 31 estimates the generation of the internal short-circuit of the battery 2 based on at least one of the derived charge-discharge ratio and the acquired voltage. The generation of the internal short-circuit can be previously estimated.

It should be understood that the embodiments disclosed herein are illustrative in all points and not restrictive. The technical features described in the embodiments can be combined with each other, and the scope of the present invention is intended to include all modifications within the claims and the scope equivalent to the claims.

DESCRIPTION OF REFERENCE SIGNS

2: battery (lead-acid battery)
3: BMU
31: controller
32: storage
33: input unit
325: learning model

The invention claimed is:

1. An estimation device comprising:
   an acquisition unit that acquires a voltage, a current, and a temperature of a lead-acid battery;
   a first deriving unit that derives a first SOC and a second SOC that are SOCs of a start point and an end point of an estimation period;
   a second deriving unit that derives a total amount of an overcharge amount that is a difference between an amount of charge and a discharge capacity in the estimation period;
   a third deriving unit that derives an actual measurement error based on a difference between the derived first SOC and the derived second SOC and the derived total amount of the overcharge amount;
   a first specification unit that specifies an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount;
   a second specification unit that specifies an abnormality degree of the derived actual measurement error based on the derived actual measurement error and the specified estimation error; and
   an estimation unit that estimates generation of an internal short-circuit of the lead-acid battery based on the specified abnormality degree.

2. An estimation device comprising:
   an acquisition unit that acquires a voltage, a current, and a temperature of a lead-acid battery;
   a first deriving unit that derives a first SOC and a second SOC that are SOCs of a start point and an end point of an estimation period;
   a second deriving unit that derives a total amount of an overcharge amount that is a difference between an amount of charge and a discharge capacity in the estimation period;
   a third deriving unit that derives an actual measurement error based on a difference between the derived first SOC and the derived second SOC and the derived total amount of the overcharge amount;
   a specification unit that inputs the derived actual measurement error, the derived first SOC, the derived second SOC, and the acquired temperature to a learning model that outputs an abnormality degree of the actual measurement error when the actual measurement error, the first SOC, the second SOC, and the temperature are input, and specifies the abnormality degree of the derived actual measurement error; and
   an estimation unit that estimates generation of an internal short-circuit of the lead-acid battery based on the specified abnormality degree.

3. An estimation method comprising:
   acquiring a voltage, a current, and a temperature of a lead-acid battery;
   deriving a first SOC and a second SOC that are SOCs of a start point and an end point of an estimation period;
   deriving a total amount of an overcharge amount that is a difference between an amount of charge and a discharge capacity in the estimation period;
   deriving an actual measurement error based on a difference between the derived first SOC and the derived second SOC and the derived total amount of the overcharge amount;
   specifying an estimation error based on the derived first SOC, the derived second SOC, and the acquired temperature, and a relationship between the first SOC, the second SOC, and the temperature of the lead-acid battery, and the estimation error derived based on the difference between the first SOC and the second SOC and the total amount of the overcharge amount;
   specifying an abnormality degree of the derived actual measurement error based on the derived actual measurement error and the specified estimation error; and
   estimating generation of an internal short-circuit of the lead-acid battery based on the specified abnormality degree.

* * * * *